US010225958B1

(12) United States Patent
Gao

(10) Patent No.: US 10,225,958 B1
(45) Date of Patent: Mar. 5, 2019

(54) LIQUID COOLING SYSTEM FOR A DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/970,620

(22) Filed: May 3, 2018

(51) Int. Cl.
H05K 7/20 (2006.01)

(52) U.S. Cl.
CPC .............................. H05K 7/20772 (2013.01)

(58) Field of Classification Search
CPC .................................................. H05K 7/20772
See application file for complete search history.

(56) References Cited

U.S. PATENT DOCUMENTS

| 7,002,799 | B2* | 2/2006 | Malone | H05K 7/20727 165/80.4 |
| 8,430,156 | B2* | 4/2013 | Malone | F04B 19/006 165/104.33 |
| 9,229,497 | B2* | 1/2016 | Dean | G06F 1/20 |
| 9,341,418 | B2* | 5/2016 | Arvelo | F28F 1/00 |
| 2009/0259343 | A1* | 10/2009 | Rasmussen | H05K 7/2079 700/282 |
| 2010/0300129 | A1* | 12/2010 | Bean, Jr. | F25B 49/005 62/129 |
| 2010/0307716 | A1* | 12/2010 | Bean, Jr. | H05K 7/20745 165/80.2 |
| 2013/0094146 | A1* | 4/2013 | Tufty | G06F 1/20 361/699 |
| 2014/0202678 | A1* | 7/2014 | Goth | H05K 7/20772 165/287 |
| 2015/0359139 | A1* | 12/2015 | Campbell | H05K 7/20772 165/80.2 |
| 2016/0136851 | A1* | 5/2016 | Campbell | H05K 7/20436 264/279 |
| 2016/0345466 | A1* | 11/2016 | Arvelo | H05K 7/20272 |
| 2016/0360649 | A1* | 12/2016 | Regimbal | H05K 7/20236 |
| 2017/0043437 | A1* | 2/2017 | Boday | B23P 15/26 |
| 2017/0045300 | A1* | 2/2017 | Boday | B23P 15/26 |
| 2017/0049009 | A1* | 2/2017 | Steinke | H05K 7/20781 |
| 2017/0127549 | A1* | 5/2017 | Lunsman | H05K 7/1489 |
| 2017/0127576 | A1* | 5/2017 | Campbell | H05K 7/2039 |
| 2017/0177041 | A1* | 6/2017 | Shelnutt | G06F 1/20 |
| 2017/0181324 | A1* | 6/2017 | Shelnutt | H05K 7/20781 |
| 2017/0354941 | A1* | 12/2017 | Brown | A61J 3/002 |
| 2017/0374767 | A1* | 12/2017 | Shelnutt | H05K 7/20781 |
| 2018/0242478 | A1* | 8/2018 | Cui | H05K 7/20772 |

* cited by examiner

Primary Examiner — Lisa Lea-Edmonds
(74) Attorney, Agent, or Firm — Womble Bond Dickinson (US) LLP

(57) ABSTRACT

Embodiments are disclosed of a server rack including a rack adapted to accommodate one or more servers, each server including one or more components. An inlet manifold is positioned in or on the rack, the inlet manifold including an embedded supply pump having an inlet and an outlet, the inlet being coupled to a main supply line and the outlet being coupled to at least one sub-loop supply line. An outlet manifold is also positioned in or on the rack, the outlet manifold including an embedded return pump having an inlet and an outlet, the pump inlet being coupled to at least one sub-loop return line and the pump outlet being coupled to a main return line. A total liquid cooling architecture is proposed for liquid cooled electronic racks and data centers.

19 Claims, 6 Drawing Sheets

LIQUID COOLING SYSTEM FOR A DATA CENTER

TECHNICAL FIELD

The disclosed embodiments relate generally to cooling systems and in particular, but not exclusively, to a liquid cooling system for a data center.

BACKGROUND

Heat removal is an important factor in computer system and data center design. The number of high-performance electronics components such as high-performance processors packaged inside servers has steadily increased, thereby increasing the amount of heat generated and dissipated during ordinary operations. Due to the rapid increase of processor, server, and rack power densities, data center thermal management can become a challenge. With increasing power densities, the air flow and the corresponding power consumption can dramatically increase in a traditional air cooling system. A proper solution is needed before the high-power density thermal management requirements exceeding the limitation of air cooling.

Liquid cooling requires delivering a liquid working fluid to cooling modules such as cold plates packaged within the server. This requires delivering liquid to the servers and to the racks within which they are housed. As a result, a liquid cooling system is very different from an air cooling system. A liquid cooling system requires more components and hardware parts for distributing and transporting cooling liquid compared to delivering cooling air with an air cooling system. Therefore, a simplified design of liquid cooling system is desirable and can bring several benefits, such as increasing the reliability, improving deployment speed, reducing the cost and so on.

Several designs exist for data center liquid cooling systems. Most use two cooling loops: a primary cooling loop (also known as an external loop) and secondary cooling loop (also known as an internal loop). In most existing solutions, a Coolant Distribution Unit (CDU) is used to thermally couple the external and internal loops. Heat is transferred from the internal loop to the external loop within the CDU and the CDU external loop connects to data center facility infrastructure. The facility infrastructure can be either a chiller plant or a chiller-less plant such as a dry cooler system or cooling tower system. The CDU internal loop connects to liquid piping, and liquid distribution manifolds, and individual cooling modules.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 3A-3E are schematic drawings of embodiments of servers having different subloop supply and sub-loop return connections.

DETAILED DESCRIPTION

Embodiments are described of an apparatus and system for liquid cooling in a data center. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Figure 1:
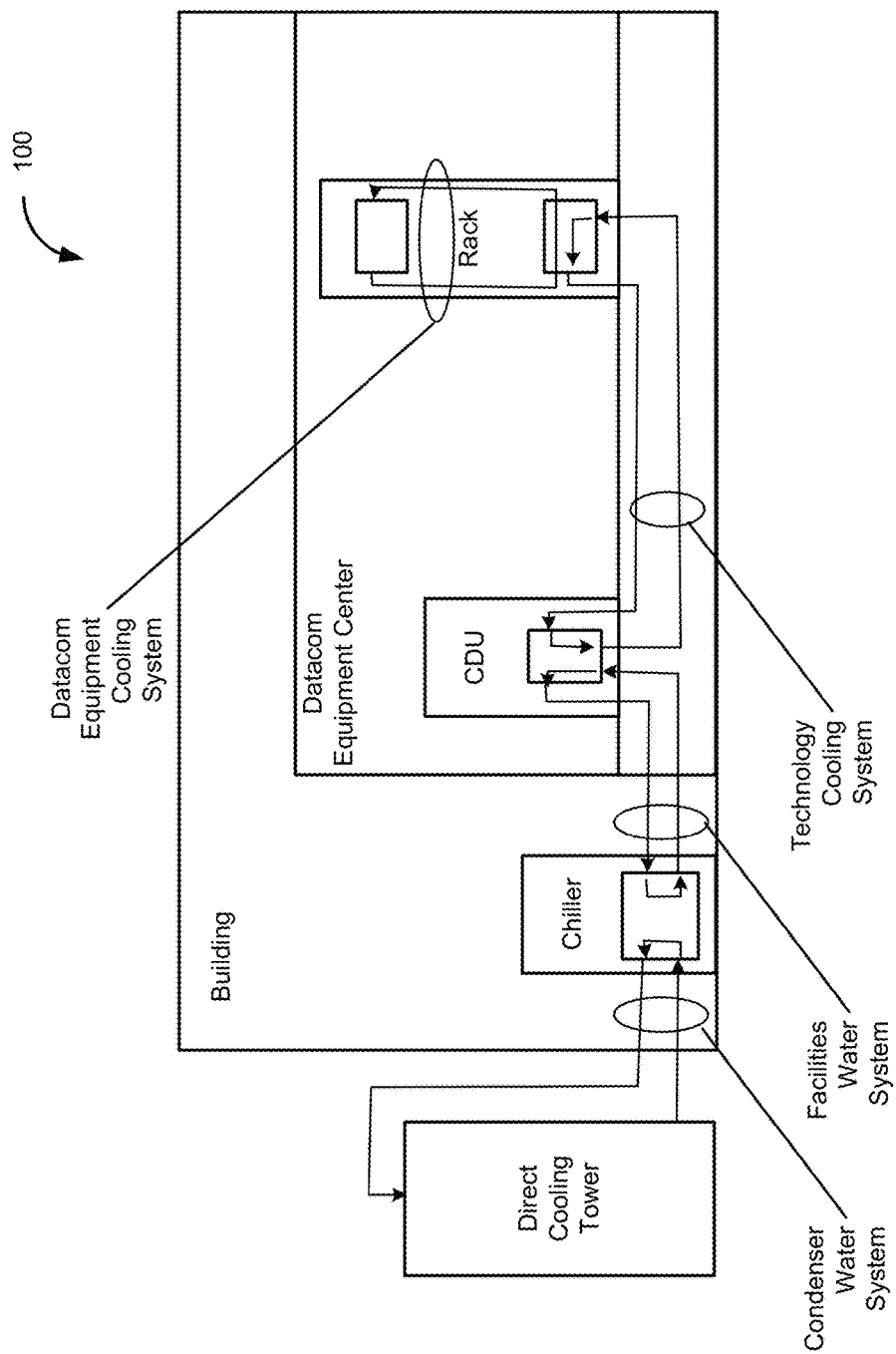
FIG. 1 is a schematic drawing of an embodiment of a data center cooling system.

FIG. 1 shows an embodiment of an existing liquid cooling system. The system includes an internal loop within the datacom equipment center and an external loop outside the datacom equipment center. A Coolant Distribution Unit (CDU) connects the internal and external loops. The major function of the CDU is to circulate working fluid through the internal loop and transfer heat from the internal loop to the external loop. In these systems, the existing CDU in the cooling infrastructure introduces several shortfalls, including:

Higher cost;
Difficult to deploy, especially for hyper-scale deployment;
More system failure points, such as more connectors on the CDU, CDU control board, and so on;
Requires consideration of equipment redundancy;
Decreases the cooling efficiency; the temperature increase on the CDU will increase the supply liquid temperature to the cooling module;
CDU requires additional complex communication and control consideration;
Requires additional maintenance;
Two different working fluids, and therefore two different fluid requirements, are needed for the external loop and the internal loop.

Figure 2A:
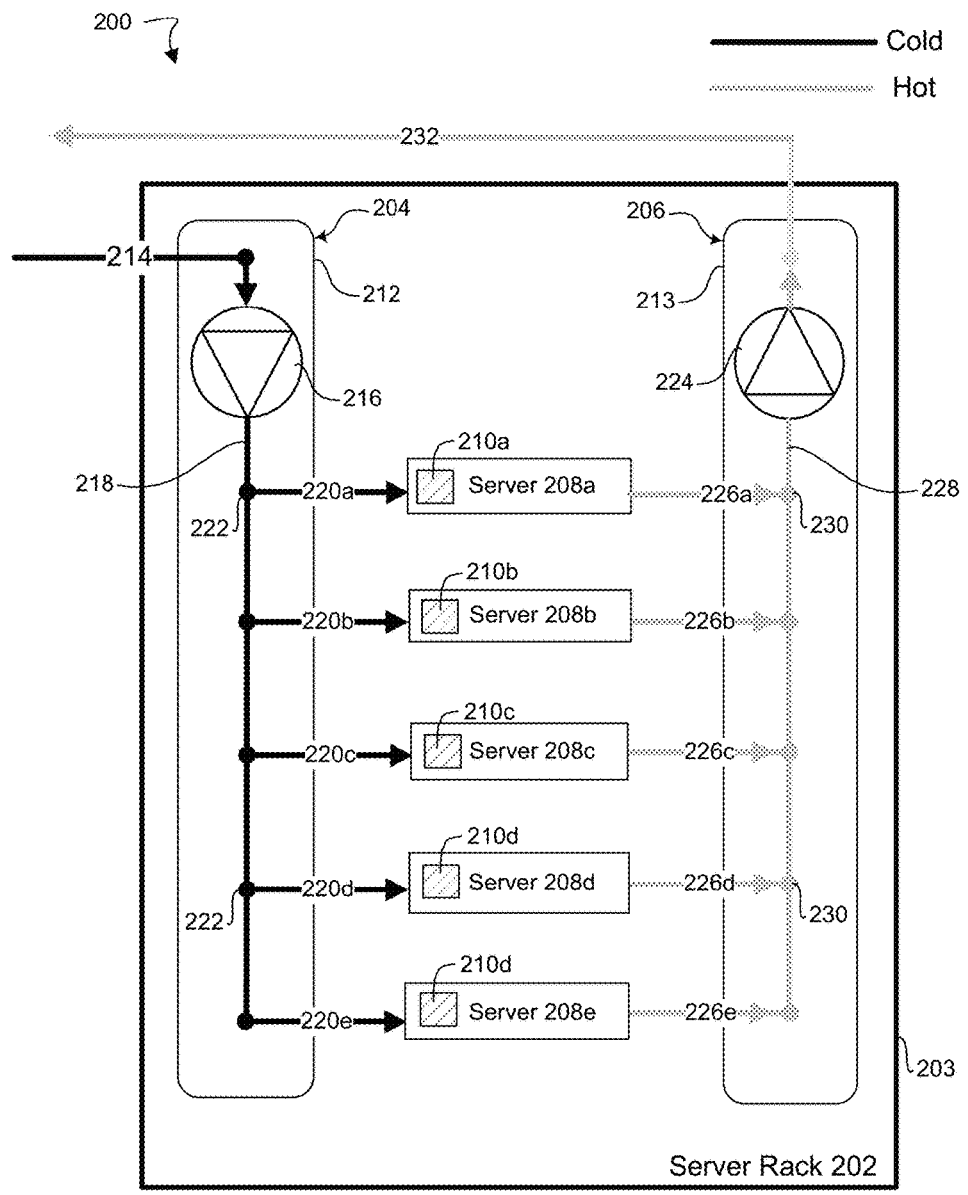
FIGS. 2A-2C are schematic drawings of embodiments of a server rack including cooling components.

FIG. 2 illustrates an embodiment of a server rack 200. Server rack 200 includes a rack 202 within which are positioned an inlet manifold 204, an outlet manifold 206, and one or more servers 208, numbered 208a-208e in the drawing. Each of the servers 208 includes one or more information technology (IT) components disposed therein. An IT component may include one or more processors, a memory, and/or a storage device, etc. that may generate heat during operations. Each of servers 208 includes at least one liquid-cooled cooling module 210—server 208a includes cooling module 210a, server 208b includes cooling module 210b, and so on—that are thermally coupled to electronic components on the servers so that they can remove heat from the components to which they are thermally coupled. In one embodiment cooling modules 210 can be cold plates, but in other embodiments they can be another type of liquid-cooled cooling module.

In the illustrated embodiment inlet manifold 204 and outlet manifold 206 are vertically positioned on opposite sides of rack 202, but in other embodiments the inlet and outlet manifolds can be positioned differently than shown. For instance, in one embodiment one manifold can be placed horizontally across the top of the rack and the other horizontally across the bottom of the rack. In still other embodiments, both manifolds can be positioned horizontally along the top of the rack or both can be positioned horizontally along the bottom of the rack. In yet other embodiments, both inlet manifold 204 and outlet manifold 206 can be combined in a single housing that can be positioned in any orientation anywhere in the rack.

The illustrated embodiment has five servers 208, numbered 208a-208e, but in other embodiments rack server rack 200 can include more or less servers 208 than shown. Each cooling module 210 on each server 208 is coupled to inlet manifold 204 by a sub-loop supply line 220 and is coupled to outlet manifold 206 via a sub-loop return line 226. Thus, for instance, server 208a is coupled to inlet manifold 204 by sub-loop supply line 220a and is coupled to outlet manifold 206 by sub-loop return line 226a, and similarly for the other servers shown. Servers 208 can be any type of server including, for instance, blade servers. One or more cooling modules 210 on each server 208 are thermally coupled to electronic components on the server that are liquid cooled. In various embodiments, for instance, the electronic components can be microprocessors, graphics processors, or other types of components that generate enough heat that it is beneficial or desirable to use liquid cooling to cool them.

Inlet manifold 204 includes a housing 212 within which are placed an embedded supply pump 216, a fluid line 218, and one or more sub-loop supply lines 220. The illustrated embodiment has five sub-loop supply lines 220a-220e, but other embodiments of server rack 200 can include more or less sub-loop supply lines than shown. Supply pump 216 has its inlet coupled to main supply line 214 and its outlet coupled to fluid line 218. Sub-loop supply lines 220 are then coupled to fluid line 218 by fluid connectors 222. Embedded pump 216 receives cool working fluid from main supply line 214 and pumps it into fluid line 218, which then distributes the received fluid into sub-loop supply lines 220. In one embodiment, pump 216 is a variable-speed pump so that it can be used to control the supply of fluid to cooling modules 210, for instance depending on their temperature (e.g., if a temperature rise is sensed in the rack, pump 216 can be sped up to deliver more working fluid to the cooling modules) or a server load. But in other embodiments pump 216 need not be a variable-speed pump. In some embodiments pump 216 can be a high-reliability pump—that is, a pump with a low mean time between failures (MTBF). Pump 216 is referred to as an embedded pump because it is positioned within housing 212 of manifold 204 and as such forms a part of the manifold.

Fluid line 218 and sub-loop supply lines 220 are coupled to the outlet of embedded pump 216 to deliver cool working fluid to cooling modules 210. In one embodiment, fluid line 218 can be a single pipe or multiple sections of pipe coupled to the outlet of embedded pump 216, but in other embodiments fluid line 218 can be a single hose or multiple hose sections coupled to the outlet of embedded pump 216. Fluid line 218 is coupled to sub-loop supply lines 220 by fluid connectors 222. In one embodiment, fluid connectors 222 can be Y-fittings, T-fittings, or some other type of fluid connector. In other embodiments, fluid connectors 222 can be valves that allow certain sub-loops to be turned off—for instance, if a server 208 and its corresponding cooling module 210 are removed from the rack. In various embodiments, fluid connectors 222 need not all be of the same type.

Inlet manifold housing 212 is used to contain all the components of inlet manifold 204, including embedded pump 216, fluid line 218, fluid connectors 222, and portions of sub-loop supply lines 220a-220e. In one embodiment, inlet manifold housing 212 can be leak-proof or leak-resistant, so that if any component within it leaks housing 212 can be used to slow down or prevent the leak from spreading into the rest of the server rack where it could damage servers 208.

Outlet manifold 206 is structured similarly to inlet manifold 204. The outlet manifold includes a housing 213 within which are positioned an embedded return pump 224 that is coupled to a fluid line 228. Fluid line 228 is in turn coupled to sub-loop return lines 226 by fluid connectors 230. All the described elements can have the same characteristics as the analogous elements as described in connection with input manifold 204. Each cooling module 210 is then coupled to the inlet manifold 212 by sub-loop supply lines 220 and to the outlet manifold 206 by outlet by sub-loop return lines 226.

In operation of rack 200, supply pump 216 pumps cool working fluid received from main supply line 214 into fluid line 218, which then distributes the cool working fluid into sub-loop supply lines 220 via fluid connectors 222. The cool working fluid then flows into cooling modules 210, where it absorbs heat from the components to which the cooling modules are attached. The heat absorbed by the working fluid increases its temperature, so that after flowing through cooling modules 210 it is considered hot working fluid instead of cool working fluid. The hot working fluid flows out of cooling modules 210 through sub-loop return lines 226 and through fluid connectors 230 into fluid line 228. Return pump 224 then pumps the hot working fluid from fluid line 228 into main return line 232.

The illustrated two-pump configuration with a supply pump and a return pump is considered a redundancy design. The pump speeds of supply pump 216 and return pump 224 can be adjusted based on different types of control signals, which enables more accurate control of the fluid flow through the rack based on the rack level cooling requirements (rack heat load). And because the pumps are embedded in the manifolds, their response can be more rapid. Another function of the manifold pump control is that when an individual rack requires different amount of fluid flow rate due to different cooling requirements from the rack heat load, the manifold pump can be adjusted accordingly and precisely. This enables achievement of localized control.

Figure 2B:
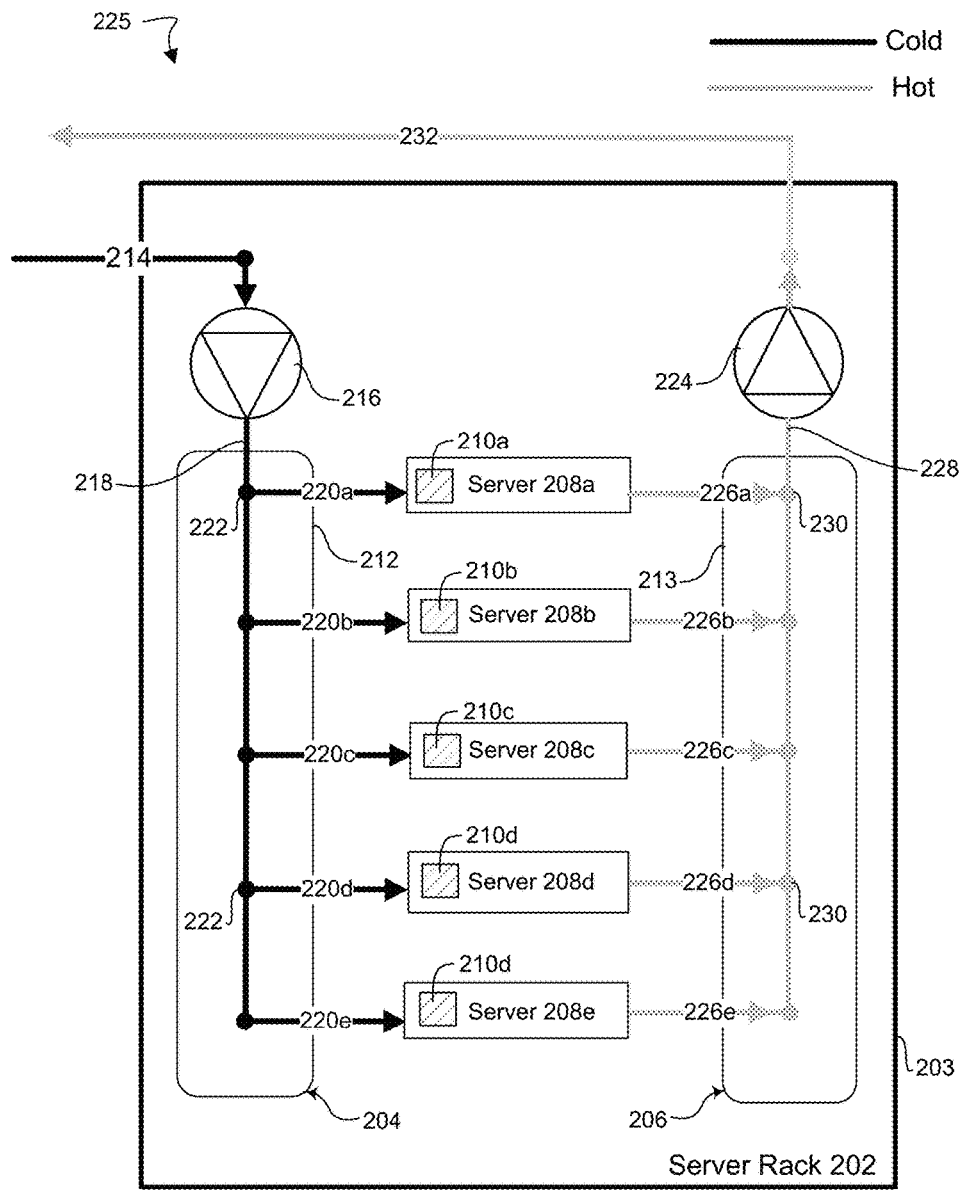

FIG. 2B illustrates an alternative embodiment of a server rack 225. Server rack 225 is in most respects similar to server rack 200. In server rack 225 supply pump 216 and return pump 224 are coupled to the same fluid connections as in server rack 200. The primary difference between server racks 225 and 200 is that in server rack 225 supply pump 216 and return pump 224 are positioned outside their respective manifold housings 212 and 213, but still within server rack 202.

Figure 2C:
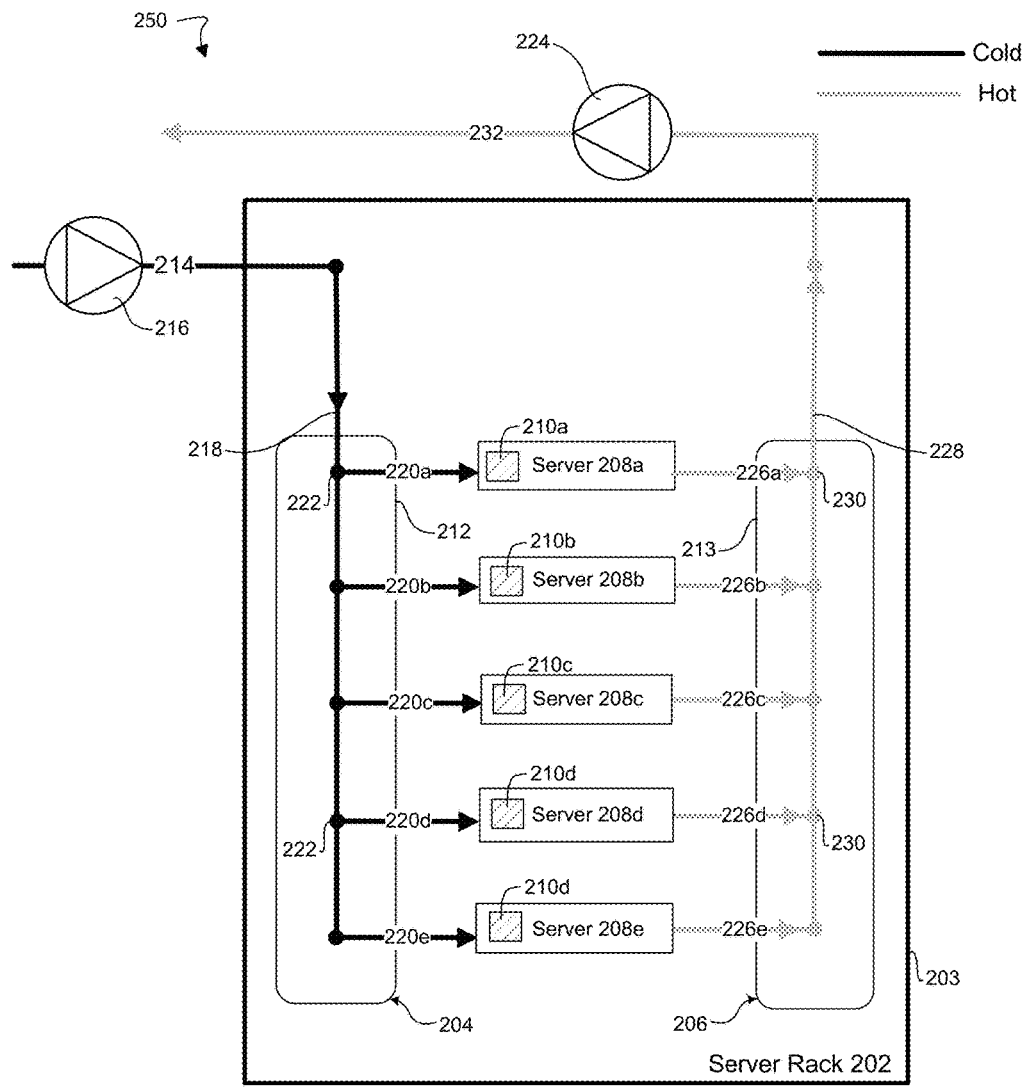

FIG. 2C illustrates an alternative embodiment of a server rack 250. Server rack 250 is in most respects similar to server rack 225. The primary difference between server racks 250 and 225 is that in server rack 250 supply pump 216 is still coupled to main supply line 214 but is positioned outside manifold housing 212 and outside server rack 202. Similarly, return pump 224 is coupled into main return line 232 and is positioned outside manifold housing 213 and outside server rack 202.

FIGS. 3A-3B illustrate embodiments of cooling module configurations and their respective connections to sub-loop supply lines and sub-loop return lines, although of course other configurations are possible besides or in addition to those shown. In the embodiment illustrated in FIG. 2 each server has one cooling module and there is a one-to-one correspondence between servers, supply lines, and return lines—that is, in FIG. 2 each server is coupled to one sub-loop supply line 220 and one sub-loop return line 226. But in other embodiments each server can include multiple cooling modules and there need not be a one-to-one correspondence between servers and sub-loop supply lines, nor between servers and sub-loop return lines. In other words, in other embodiments a server 208 can have more than one cooling module and can be serviced by more than one sub-loop supply line 220 and/or more than one sub-loop return line 226. In still other embodiments, the number of sub-loop supply lines 220 associated with a server 208 need not be the same as the number of subloop return lines 226 associated with the same server.

FIG. 3A illustrates an embodiment of a server 300 that includes a substrate 302, for instance a printed circuit board. Electronic components 304a and 304b are mounted on substrate 302, and each component 304 has a cooling module 306 thermally coupled to it: component 304a is coupled to cooling module 306a and component 304b to cooling module 306b. Each cooling module 306 has an inlet, an outlet, and channels within its interior through which working fluid can flow from inlet to outlet. Thermal coupling of cooling modules 306 to components 304 facilitates transfer of heat from the component to the working fluid flowing through each cooling module. In the illustrated configuration, cooling modules 306a and 306b are fluidly coupled in series. A single sub-loop supply line 220a supplies working fluid to both cooling modules 306a-306b and a single sub-loop return line 226a extracts working fluid from both plates, so that there is a one-to-one correspondence between supply lines and servers and between return lines and servers.

FIG. 3B illustrates another embodiment of a server. As in FIG. 3A, each component 304 is thermally coupled to a corresponding cooling module 306. Cooling modules 306a-306c are coupled in a mixed parallel/series arrangement. A single sub-loop supply line 220a supplies working fluid to all three cooling modules 306a-306c and a single sub-loop return line 226a extracts working fluid from all three cooling modules, so that there is a one-to-one correspondence between supply lines and servers and between return lines and server, despite the fact that there are multiple cooling modules on the server.

FIG. 3C illustrates another embodiment of a server. As in FIG. 3A, each component 304 is thermally coupled to a corresponding cooling module 306. A single sub-loop supply line 220a supplies working fluid to cooling module 306a and a single sub-loop supply line 220b supplies working fluid to cooling module 306b. Similarly, a single sub-loop return line 226a extracts working fluid from cooling module 306a and a single sub-loop return line 226b extracts working fluid from cooling module 306b, so that there is a many-to-one correspondence between supply lines and servers and between return lines and servers.

FIG. 3D illustrates another embodiment of a server. As in FIG. 3B, each component 304 is thermally coupled to a corresponding cooling module 306. Cooling modules 306a-306c are coupled in a mixed parallel/series arrangement. A single sub-loop supply line 220a supplies working fluid to all three cooling modules 306a-306c, but multiple sub-loop return lines 226a and 226b extract working fluid from the cooling modules, so that there is a one-to-one correspondence between sub-loop supply lines and servers, but a many-to-one correspondence between sub-loop return lines and servers.

Figure 3E:
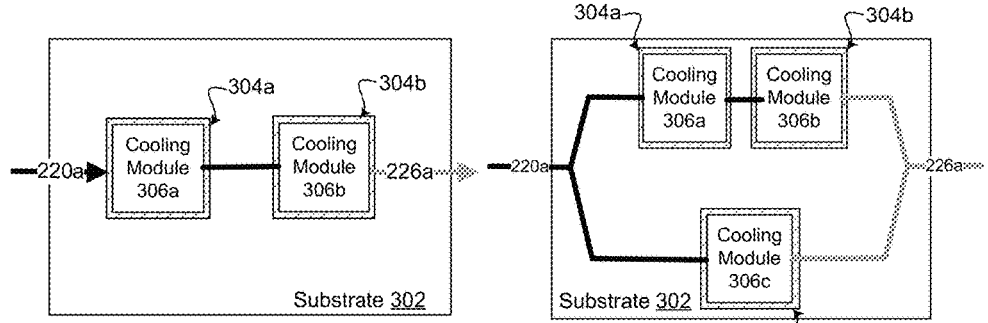
Figure 3E:
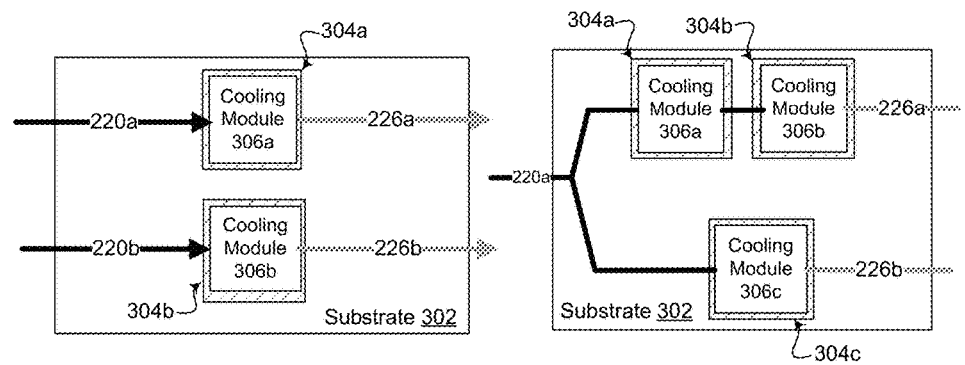
Figure 3E:
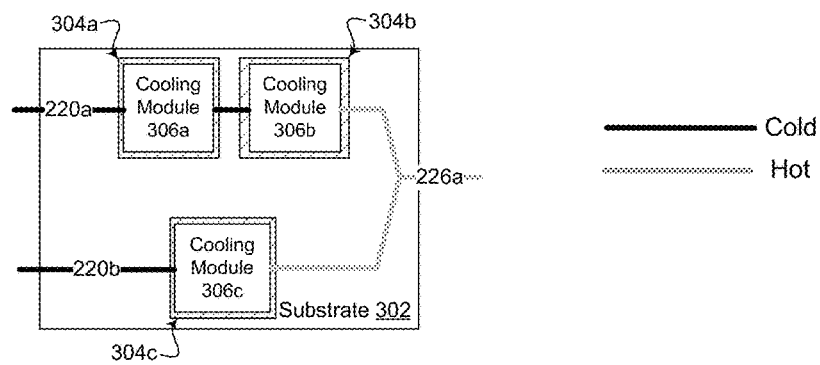

FIG. 3E illustrates another embodiment of a server. As in FIG. 3D, each component 304 is thermally coupled to a corresponding cooling module 306. Cooling modules 306a-306c are coupled in a mixed parallel/series arrangement. Multiple sub-loop supply lines 220a and 220b supply working fluid to cooling modules 306, and a single sub-loop return line 226a extracts working fluid from all three cooling modules 306a-306c, so that there is a many-to-one correspondence between sub-loop supply lines and servers but a one-to-one correspondence between sub-loop return lines and servers.

Figure 4:
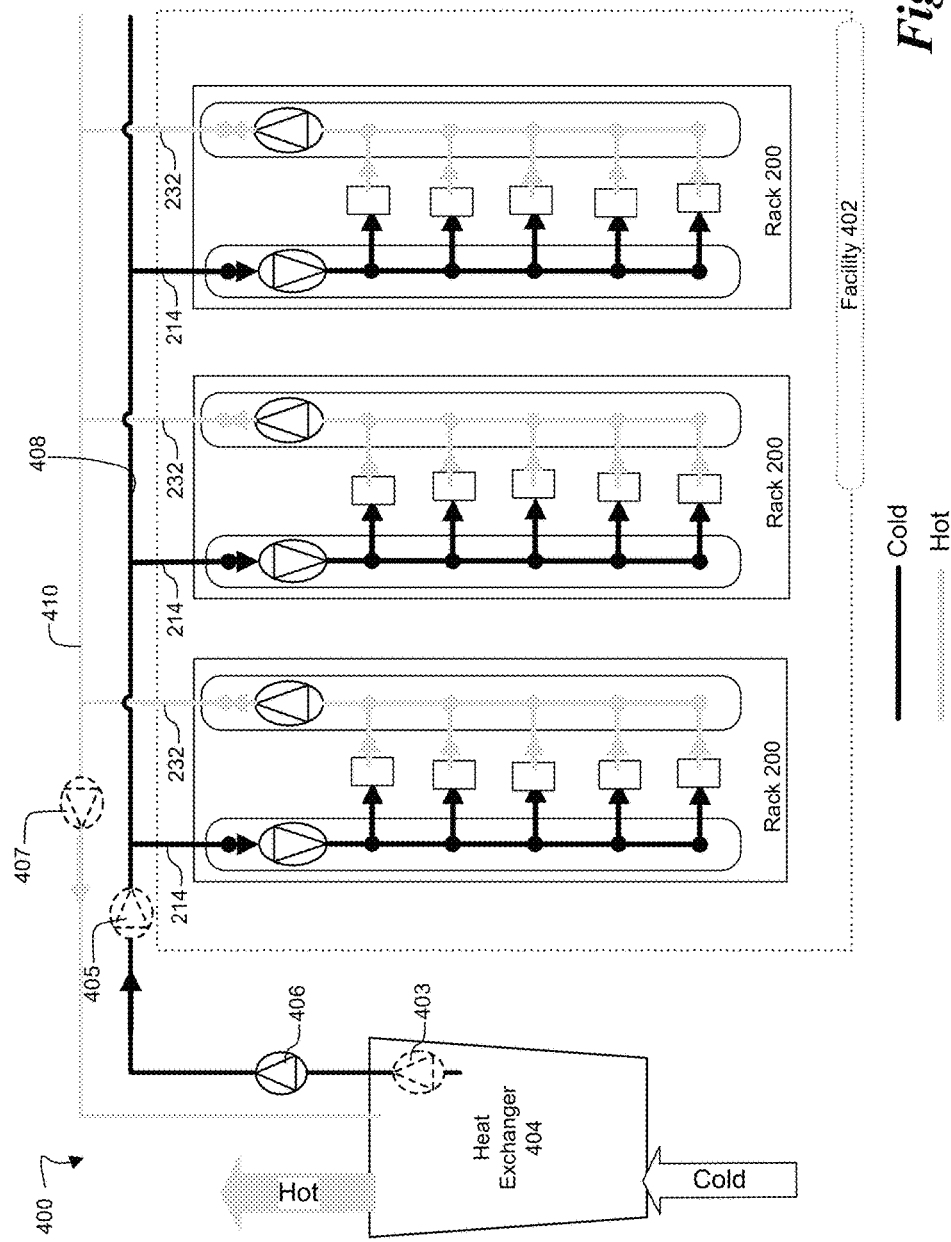
FIG. 4 is a schematic drawing of an embodiment of a data center liquid cooling system including one or more server racks such as the one shown in FIG. 2.

FIG. 4 illustrates an embodiment of a single-loop data center cooling system 400. In cooling system 400, a plurality of server racks such as server racks 200 (see FIG. 2) are positioned inside a facility 402. Facility 402 can be a complete building, a subset of a building (e.g., a room or compartment within a building), or some other type of enclosure. A heat exchanger 404 is positioned outside facility 402. In the illustrated embodiment heat exchanger 404 is a liquid-to-atmosphere heat exchanger that transfers heat from the working liquid that circulates through server racks 200 into the atmosphere. But in other embodiments heat exchanger 404 can be a different type of heat exchanger, for instance a liquid-to-liquid heat exchanger. In embodiments in which heat exchanger 404 is a liquid-to-liquid heat exchanger, a natural water resource such as sea water or lake water can be used by the heat exchanger. In embodiments in which heat exchanger 404 is liquid-to-air heat exchanger, heat exchanger 404 can be a dry cooler, a cooling tower or an evaporative cooler.

Facility pump 406 has its inlet coupled to the liquid outlet of heat exchanger 404 and has its outlet coupled to facility supply line 408. The main supply line 214 of each server rack 200 is then coupled to facility supply line 408. Facility return line 410 is coupled to the main return line 232 of each server rack 200 and is also coupled to the liquid inlet of heat exchanger 404. Different data center infrastructures may require a slightly modification on the facility liquid piping, but in any event cooling system 400 is a single-loop cooling system.

In various embodiments, facility pump 406 can be either packaged within heat exchanger 404 or designed as an external component. In the figure, facility pumps 403, 405, and 407, shown in dashed lines to indicate that they are optional, illustrate locations where facility pumps can be put instead of, or in addition to, pump 406. For instance, in some embodiments a facility pump 405 can be positioned in facility supply line 408 and/or a facility pump 407 can be positioned in facility return line 410. In other embodiments a facility pump 403 can be positioned within heat exchange. Still other embodiments can have multiple facility pumps for redundancy or high flow rate or high-pressure requirements. The system fluid flow rate can be controlled by the facility pump and manifold pump together. Basically, the facility pump provides major driving force for the fluid flowing in the system, and the manifold pumps have two main functions: providing additional driving force and controlling the amount of flow rate based on the rack heat load. Different control strategies for the facility pump and manifold pump can be developed.

In operation, facility pump 406 pumps cool working fluid from heat exchanger 404 into facility supply line 408, which then supplies the cool working fluid to the main supply line 214 of each server rack 200. The embedded supply pump within the inlet manifold of each server rack 200 pumps the cool working fluid into the sub-loop supply lines, which then deliver the cool working fluid to the cooling modules on the servers. As the working fluid circulates through cooling modules on the servers, it absorbs heat and becomes hotter so that hot working fluid emerges through sub-loop return lines and into the outlet manifold. The embedded return pump within the outlet manifold then pumps the hot working fluid into facility return line 410, which returns the hot working fluid to heat exchanger 404. As the hot working fluid circulates through heat exchanger 404 cool air, for instance from the atmosphere, circulates through heat exchanger 404 and removes heat from the hot working fluid, so that it can again be circulated through the server racks 200 by facility pump 406.

The disclosed embodiments provide a liquid cooling system for a data center. The cooling system design uses only one heat transfer loop to remove the heat from electronics inside a data center and transfers the heat outside the data center, for instance to the atmosphere. The system includes an external cooling unit, a rack-mounted manifold and cooling modules. The system only requires one heat transfer loop, so it eliminates the CDU and the chiller of a conventional system. The pump used in a CDU is replaced by the facility pump and rack pumps (i.e., supply and return pumps) that are embedded in the manifolds. The heat exchange function of the CDU is replaced by the external cooling unit. The other functions of the CDU such as fluid control and fluid filtration can be replaced by the entire system. And pumps embedded in the manifolds allow for advanced flow management. This enables several potential advantages, among them:

1. Simplified design: It needs to be mentioned again that there is only one heat transfer loop in the entire liquid system; Eliminating coolant distribution unit.
2. High energy efficiency: chiller-less design means no chiller compressor power consumption; only one heat transfer loop means temperature increase from ambient (cooling source) to the cooling water supply to cooling module is minimized; less pumping power consumption since system flow network is simplified; the manifold pump speed can be adjusted based on the cooling need or rack heat load/heat density.
3. High reliability: Eliminating several potential failure possibilities of a CDU and its accessories; redundant design on rack manifold pumps; significant decrease of amount of fluid connection parts used in the system.
4. Cost reduction: This novel design may provide several possibilities to reduce the initial cost on the system; some floor space can be saved.
5. Single fluid speciation requirement: since only one liquid cooling loop, therefore the requirement on the fluid specification is eliminated to one.
6. Fast and easy deployment, easy to maintenance.
7. Compatible with different types of data centers.
8. Modular design concept.

The above description of embodiments is not intended to be exhaustive or to limit the invention to the described forms. Specific embodiments of, and examples for, the invention are described herein for illustrative purposes, but various modifications are possible.

What is claimed is:

1. A server rack comprising:
   a rack adapted to accommodate one or more servers, each server including one or more components;
   an inlet manifold positioned in or on the rack, the inlet manifold including an embedded supply pump having an inlet and an outlet, the inlet being coupled to a main supply line and the outlet being coupled to at least one sub-loop supply line; and
   an outlet manifold positioned in or on the rack, the outlet manifold including an embedded return pump having an inlet and an outlet, the pump inlet being coupled to at least one sub-loop return line and the pump outlet being coupled to a main return line.

2. The server rack of claim 1, further comprising an inlet manifold housing within which the inlet manifold is positioned and an outlet manifold housing within which the outlet manifold is positioned.

3. The server rack of claim 1, further comprising a single housing within which the inlet manifold and the outlet manifold are positioned.

4. The server rack of claim 1, further comprising one more servers positioned in the rack.

5. The server rack of claim 4 wherein at least one component on each server is coupled to a liquid-cooled cooling module, each liquid-cooled cooling module being coupled to a sub-loop supply line and a sub-loop return line so that each liquid-cooled cooling module and its sub-loop supply line and sub-loop return line form a cooling sub-loop.

6. The server rack of claim 5 wherein the embedded supply pump and the embedded return pump are variable-speed pumps, such that the supply pump and return pump can control the flow rate of a working fluid through each cooling sub-loop.

7. The server rack of claim 1 wherein the main supply line extends from outside the rack to the embedded supply pump and the main return line extends from the embedded return pump to outside the rack.

8. A data center comprising:
   a facility;
   a plurality of server racks positioned within the facility, each server rack including:
      a rack housing therein one or more servers, each server including one or more components,
      an inlet manifold positioned in or on the rack, the inlet manifold including an embedded supply pump having an inlet and an outlet, the inlet being coupled to a main supply line and the outlet being coupled to at least one sub-loop supply line,
      an outlet manifold positioned in or on the rack, the outlet manifold including an embedded return pump having an inlet and an outlet, the pump inlet being coupled to at least one sub-loop return line and the pump outlet being coupled to a main return line, and
      wherein at least one component on each server is coupled to a liquid-cooled cooling module, each liquid-cooled cooling module being coupled to a sub-loop supply line and a sub-loop return line so that each liquid-cooled cooling module and its sub-loop supply line and sub-loop return line form a cooling sub-loop;
   a facility supply line coupled to the main supply line of each inlet manifold;
   a facility return line coupled to the main return line of each outlet manifold;
   a heat exchanger positioned outside the facility and coupled to the facility supply line and the facility return line;
   a facility pump coupled in the facility supply line.

9. The data center of claim 8 wherein the heat exchanger is a liquid-to-liquid heat exchanger or a liquid-to-atmosphere heat exchanger.

10. The data center of claim 8 wherein each server rack further comprises an inlet manifold housing within which the inlet manifold is positioned and an outlet manifold housing within which the outlet manifold is positioned.

11. The data center of claim 8 wherein each server rack further comprises a single housing within which the inlet manifold and the outlet manifold are positioned.

12. The data center of claim 11 wherein at least one component on each server is coupled to a liquid-cooled cooling module, each liquid-cooled cooling module being coupled to a sub-loop supply line and a sub-loop return line so that each liquid-cooled cooling module and its sub-loop supply line and sub-loop return line form a cooling sub-loop.

13. The data center of claim 12 wherein the embedded supply pump and the embedded return pump are variable-speed pumps, such that the supply pump and return pump can control the flow rate of a working fluid through each cooling sub-loop.

14. The data center of claim 8 wherein the main supply line extends from outside the rack to the embedded supply pump and the main return line extends from the embedded return pump to outside the rack.

15. A server rack comprising:
a rack housing therein one or more servers, each server including one or more components;
an inlet manifold positioned in or on the rack, the inlet manifold including an embedded supply pump having an inlet and an outlet, the inlet being coupled to a main supply line and the outlet being coupled to at least one sub-loop supply line; and
an outlet manifold positioned in or on the rack, the outlet manifold including an embedded return pump having an inlet and an outlet, the pump inlet being coupled to at least one sub-loop return line and the pump outlet being coupled to a main return line;
wherein at least one component on each server is coupled to a liquid-cooled cooling module, each liquid-cooled cooling module being coupled to a sub-loop supply line and a sub-loop return line so that each liquid-cooled cooling module and its sub-loop supply line and sub-loop return line form a cooling sub-loop.

16. The server rack of claim 15, further comprising an inlet manifold housing within which the inlet manifold is positioned and an outlet manifold housing within which the outlet manifold is positioned.

17. The server rack of claim 15, further comprising a single housing within which the inlet manifold and the outlet manifold are positioned.

18. The server rack of claim 17 wherein the embedded supply pump and the embedded return pump are variable-speed pumps, such that the supply pump and return pump can control the flow rate of a working fluid through each cooling sub-loop.

19. The server rack of claim 15 wherein the main supply line extends from outside the rack to the embedded supply pump and the main return line extends from the embedded return pump to outside the rack.

* * * * *